United States Patent [19]
Eriksson et al.

[11] Patent Number: 5,929,709
[45] Date of Patent: Jul. 27, 1999

[54] PROTECTIVE CIRCUIT

[75] Inventors: Hans Eriksson, Järfälla; Elisabeth Larsson, Bromma, both of Sweden

[73] Assignee: Telefonaktiebolaget LM Ericsson, Stockholm, Sweden

[21] Appl. No.: 08/961,207

[22] Filed: Oct. 30, 1997

[30]     Foreign Application Priority Data

Nov. 8, 1996 [SE]  Sweden ................................. 9604100

[51] Int. Cl.⁶ .............................. H03F 3/04; H03F 21/00
[52] U.S. Cl. ........................................ 330/298; 330/207 P
[58] Field of Search ................... 330/207 P, 298, 330/51; 361/91

[56]             References Cited

U.S. PATENT DOCUMENTS 4,042,889  8/1977  Baker ................................. 330/207 P
4,158,863  6/1979  Naylor ..................................... 361/56

FOREIGN PATENT DOCUMENTS 32 46 659   11/1985  Germany .
WO90/09703   8/1990  WIPO .

*Primary Examiner*—Robert Pascal
*Assistant Examiner*—Patricia T. Nguyen
*Attorney, Agent, or Firm*—Burns, Doane, Swecker & Mathis. L.L.P.

[57]             ABSTRACT

A protective circuit in a power amplifier is adapted, by limiting the maximum output current of the power amplifier and by quickly recharging compensating capacitors in the power amplifier, to limit the amount and duration of the power drain in the power amplifier upon over-excitation of the power amplifier.

2 Claims, 1 Drawing Sheet

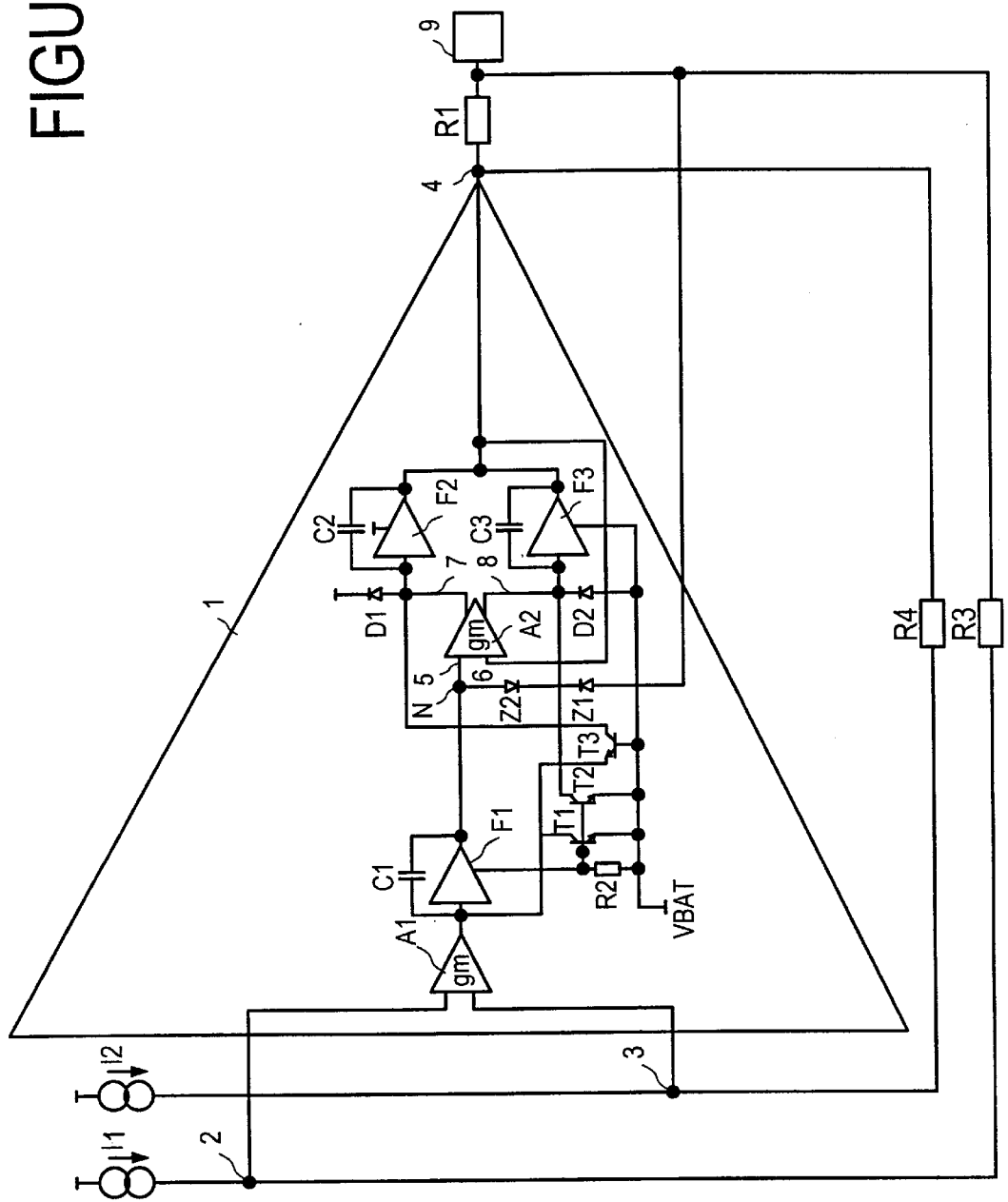
FIGURE

PROTECTIVE CIRCUIT

TECHNICAL FIELD

The invention relates to a protective circuit and more specifically to a protective circuit for protecting a power amplifier in a subscriber line interface circuit against sudden voltage changes, e.g. caused by lightning strikes, on the associated telephone line.

BACKGROUND

When sudden voltage changes appear on the output terminal of a power amplifier, the power amplifier will be over-excited and give rise to a maximum output current and power loss until all compensating capacitors in the power amplifier have been recharged to the new voltage appearing on the output terminal. This can lead to the destruction of the power amplifier.

Current limitation in power amplifiers is effected in a manner known per se in that a resistor is interconnected in series with the power transistors in the amplifiers. When the current in such a resistor becomes high enough, a transistor is caused to conduct so that the driving current is shunted past the power transistor. The problem with these series resistors is that they, also during normal conditions, require extra overhead voltage which is not always readily available.

SUMMARY

The object of the invention is to limit the output current in a power amplifier to its value as well as duration in case of over-excitation.

This is generally attained in that compensating capacitors in the power amplifier upon over-excitation are recharged quicker in accordance with the invention than in known power amplifiers.

Hereby, the duration of a damaging, high output current will be restricted.

BRIEF DESCRIPTION OF THE DRAWING

The invention will be described more in detail below with reference to the appended drawing, on which the single figure shows a power amplifier known per se, having an embodiment of a protective circuit in accordance with the invention.

DETAILED DESCRIPTION

The figure shows a power amplifier known per se, having a protective circuit in accordance with the invention. The power amplifier is generally denoted 1 and has two input terminals 2 and 3, respectively, and one output terminal 4.

In a manner known per se, the power amplifier 1 comprises a transconductance amplifier A1 having two input terminals and one output terminal. The input terminals of the transconductance amplifier A1 are connected to the input terminals 2, 3 of the power amplifier 1 and, thus, constitute, at the same time, the input terminals of the power amplifier shown. The output terminal of the transconductance amplifier A1 is connected to the input terminal of an integrator-coupled amplifier F1 between whose input terminal and output terminal, a compensating capacitor C1 is connected.

The output terminal of the amplifier F1 is connected, via a node N, to a first input terminal 5 of a transconductance amplifier A2 whose other input terminal 6 is connected to the output terminal 4 of the power amplifier 1.

The transconductance amplifier A2 has two output terminals 7 and 8; the output terminal 7 being connected to the input terminal of an integrator-coupled amplifier F2 between whose input terminal and output terminal a compensating capacitor C2 is connected and whose output terminal is connected to the output terminal 4 of the power amplifier 1. The supply voltage terminal of the amplifier F2 is connected to ground.

In a corresponding manner, the output terminal 8 of the transconductance amplifier A2 is connected to the input terminal of an integrator-coupled amplifier F3 between whose input terminal and output terminal a compensating capacitor C3 is connected and whose output terminal is also connected to the output terminal 4 of the power amplifier 1. The supply voltage terminal of the amplifier F3 is connected to a supply voltage VBAT.

The components hitherto described as being included in the power amplifier 1, are components that are normally included in such an amplifier.

The embodiment of the protective circuit in accordance with the invention, illustrated on the drawing, comprises a first resistor R1 which is interconnected between the output terminal 4 of the power amplifier 1 and a wire connection terminal 9 via which the line interface circuit, not shown in any detail, is intended to feed one wire of a two-wire telephone line (not shown).

To anti-series connected zener diodes Z1 and Z2 are interconnected between the wire connection terminal 9 and the node N, i.e. the interconnection point between the output terminal of the amplifier F1 and the input terminal 5 of the transconductance amplifier A2.

A resistor R2 is interconnected between the supply voltage terminal of the amplifier F1 and the supply voltage VBAT. The supply voltage terminal of the amplifier F1 is, moreover, connected to the base of two transistors T1 and T2, whose emitters are connected to the supply voltage VBAT.

The collector of the transistor T1 is connected, on the one hand, to the input terminal of the amplifier F1 and, on the other hand, to the emitter of a transistor T3. The base of the transistor T3 is connected to the supply voltage VBAT and its collector is connected, on the one hand, to the input terminal of the amplifier F2 and, on the other hand, to the anode of a diode D1 whose cathode is connected to ground.

The collector of the transistor T2 is connected, on the one hand, to the input terminal of the amplifier F3 and, on the other hand, to the cathode of a diode D2 whose anode is connected to the supply voltage VBAT.

In the embodiment shown on the drawing, the input terminals 2 and 3 of the power amplifier 1 are connected, on the one hand, to a respective current generator I1 and I2, respectively, and, on the other hand, via a respective resistor R3 and R4, respectively, to the wire connection terminal 9 and the output terminal 4, respectively, of the power amplifier 1.

In normal operation, the output current from the power amplifier 1 is an amplified copy of the difference between the input currents I1 and I2. In this condition, the voltage on the wire connection terminal 9 is equal to the voltage in the node N. i.e. the interconnection point between the output terminal of the amplifier F1, the input terminal 5 of the transconductance amplifier A2 and the anode of the zener diode Z2.

At sudden positive or negative changes of the voltage on the wire connection terminal 9, the voltage in the node N will not change quite as sudden since the voltage in the node N is limited by the slew rate of the amplifier F1.

The voltage difference between the wire connection terminal 9 and the node N corresponds to the zener voltage of the zener diode Z1 or Z2. When this voltage difference amounts to the zener voltage for the zener diode Z1 or Z2, also the voltage in the node N will be forced to change by voltage changes on the wire connection terminal 9. Thus, the voltage difference between the wire connection terminal 9 and the node N will be kept constant at the zener voltage for Z1 or Z2. whereby the maximum output current of the power amplifier 1 will be limited to the zener voltage divided by the resistance of the resistor R1.

If the change of the voltage on the wire connection terminal 9 is larger than the zener voltage of the zener diode Z1 or Z2, thus, also the voltage in the node N will be changed by force.

At a quick, positive change of the voltage in the node N, the current through the resistor R2 will be so large that the transistor T1 starts to conduct. Hereby, the capacitor C1 across the amplifier F1 will quickly be recharged to the voltage appearing in the node N. In the same manner, the capacitor C3 across the amplifier F3 will be recharged through the transistor T2 which also becomes conductive by the voltage drop across the resistor R2.

The capacitor C2 across the amplifier F2 will also be recharged through the diode D1, but this is not critical since the amplifier F2 is not active under the circumstances in view of the fact that its supply voltage terminal is connected to ground.

At a quick, negative change of the voltage in the node N, the capacitor C1 will attempt to pull the emitter of the transistor T3 to a voltage below the supply voltage VBAT. Hereby, the transistor T3 becomes conductive and the capacitor C1 is quickly recharged to the voltage appearing in the node N. The charging current for the capacitor C1 through the transistor T3 is also used to quickly recharge the capacitor C2. The capacitor C3 is recharged via the diode D2, but this recharging is not critical since the amplifier F3 is not active under the circumstances.

By quickly recharging the compensating capacitors included in the power amplifier by means of the protective circuit according to the invention, thus, upon over-excitation, the maximum output current that can be outputted by the power amplifier, on the one hand, and the time during which the power amplifier is over-excited and outputs the maximum output current, on the other hand, are limited.

The protective circuit described above for protecting the power amplifier 1 against sudden positive and negative voltage changes appearing on its output terminal 4, is according to the invention adapted to quickly recharge the compensating capacitors C1, C2, C3 included in the power amplifier 1. By quickly recharging the capacitors C1, C2 and C3, each individual amplifier F1, F2 and F3, respectively, in the power amplifier 1 is, thus, protected. Therefore, the protection of the power amplifier 1 is based on the protection of the respective amplifier F1, F2 and F3.

Thus, the amplifier F1 is protected in accordance with what has been stated above against sudden, positive voltage changes appearing on its output terminal, i.e. in the node N, in that the transistor T1 becomes conductive and establishes a current path to the supply voltage VGAT so that the capacitor C1 is quickly recharged.

Against sudden, negative voltage changes appearing on its output terminal, i.e. in the node N, the amplifier F1 is protected in accordance with what has been stated above in that the transistor T3 becomes conductive and establishes a current path via the diode D1 to ground so that the capacitor C1 is recharged.

It should be pointed out that the transistors T1 and T3, in the general case, can be replaced by other switches known per se.

In the embodiment of the power amplifier 1 and the protection circuit illustrated on the drawing, both amplifiers F2 and F3 are protected in accordance with what has been stated above by recharging the associated capacitor C2 and C3, respectively, via a current path established by the diode D1 to ground and via a current path established by the transistor T2 to the supply voltage VBAT, respectively. In view of the fact that the output terminals of the amplifiers F2 and F3 are interconnected, the capacitor C2 will thus be recharged at sudden, negative voltage changes, while the capacitor C3 will be recharged at sudden, positive voltage changes.

What is claimed is:

1. In an amplifier having a capacitor interconnected between its input terminal and its output terminal, a protective circuit for protecting the amplifier against sudden voltage changes appearing on its output terminal, comprising:

a first switch adapted, at a positive voltage change on the output terminal of the amplifier, to establish a first current path from the input terminal of the amplifier to a first supply voltage source to recharge the capacitor to the voltage on the output terminal of the amplifier, and a second switch adapted, at a negative voltage change on the output terminal of the amplifier, to establish a second current path from the input terminal of the amplifier to a second supply voltage source to recharge the capacitor to the voltage on the output terminal of the amplifier.

2. A protective circuit for a power amplifier having two input terminals and one output terminal in a line interface circuit for feeding one wire of a telephone line via a wire connection terminal, the power amplifier including:

a first transconductance amplifier having two input terminals and one output terminal, the input terminals of the transconductance amplifier being the input terminals of the power amplifier, and the output terminal of the transconductance amplifier being connected to the input terminal of a first amplifier between whose input terminal and output terminal a first capacitor is connected, a second transconductance amplifier having two input terminals and two output terminals, a first one of the input terminals being connected to the output terminal of the first amplifier and a second one of the input terminals being connected to the output terminal of the power amplifier, a second amplifier between whose input terminal and output terminal a second capacitor is connected and whose input terminal is connected to the first output terminal of the second transconductance amplifier, whose output terminal is connected to the output terminal of the power amplifier, and whose supply voltage terminal is connected to ground, a third amplifier between whose input terminal and output terminal a third capacitor is connected and whose input terminal is connected to the second output terminal of the second transconductance amplifier, whose output terminal is connected to the output terminal of the power amplifier, and whose supply voltage terminal is connected to a supply voltage, the protective circuit comprising:

a first resistor interconnected between the output terminal of the power amplifier and the wire connection terminal, two anti-series connected zener diodes interconnected between the wire connection terminal and the output terminal of the first amplifier, a second resistor interconnected between the supply voltage terminal of the first amplifier and the supply voltage, the supply voltage terminal being connected to the base of a first transistor and to the base of a second transistor, the emitters of the first and second transistors being connected to the supply voltage, the collector of the first transistor being connected to the input terminal of the first amplifier and to the emitter of a third transistor whose base is connected to the supply voltage and whose collector is connected to the input terminal of the second amplifier and to an anode of a first diode whose cathode is connected to ground, the collector of the second transistor being connected to the input terminal of the third amplifier and to a cathode of a second diode whose anode is connected to the supply voltage.

* * * * *